(12) United States Patent
Shoji

(10) Patent No.: US 7,974,797 B2
(45) Date of Patent: Jul. 5, 2011

(54) METHOD AND APPARATUS FOR CONFIRMING THE CHARGE AMOUNT AND DEGRADATION STATE OF A BATTERY, A STORAGE MEDIUM, AN INFORMATION PROCESSING APPARATUS, AND AN ELECTRONIC APPARATUS

(75) Inventor: Hideki Shoji, Iwaki (JP)

(73) Assignee: Toyo System Co., Ltd., Iwaki (JP)

( * ) Notice: Subject to any disclaimer, the term of this patent is extended or adjusted under 35 U.S.C. 154(b) by 191 days.

(21) Appl. No.: 12/199,374

(22) Filed: Aug. 27, 2008

(65) Prior Publication Data
US 2009/0024339 A1 Jan. 22, 2009

Related U.S. Application Data

(62) Division of application No. 10/721,464, filed on Nov. 26, 2003, now Pat. No. 7,429,849.

(51) Int. Cl.
*G01R 31/36* (2006.01)
(52) U.S. Cl. .......... 702/63; 320/130; 320/132; 320/134; 320/136; 320/150; 320/155; 324/429; 324/427; 324/426; 340/636; 340/455
(58) Field of Classification Search .................... 702/63; 320/122, 125, 130, 132, 134, 136, 139, 141, 320/150, 155; 324/426, 427, 429; 340/455, 340/636; 429/91; 307/107
See application file for complete search history.

(56) References Cited

U.S. PATENT DOCUMENTS

| | | | | |
|---|---|---|---|---|
| 3,848,181 A | * | 11/1974 | Hebert et al. ................. | 324/429 |
| 4,034,598 A | * | 7/1977 | Ames et al. ....................... | 73/40 |
| 5,652,500 A | * | 7/1997 | Kadouchi et al. ............. | 320/150 |
| 5,939,861 A | * | 8/1999 | Joko et al. ..................... | 320/122 |
| 6,037,749 A | * | 3/2000 | Parsonage ..................... | 320/132 |
| 6,057,671 A | | 5/2000 | Kuno | |
| 6,144,188 A | * | 11/2000 | Okada et al. .................. | 320/141 |
| 6,380,717 B2 | * | 4/2002 | Murakami et al. ............ | 320/150 |
| 6,563,318 B2 | | 5/2003 | Kawakami et al. | |
| 6,583,592 B2 | | 6/2003 | Omata et al. | |
| 6,683,440 B2 | | 1/2004 | Kawakami et al. | |
| 7,019,506 B2 | * | 3/2006 | Kernahan ...................... | 323/284 |
| 7,253,587 B2 | * | 8/2007 | Meissner ...................... | 320/132 |
| 7,391,183 B2 | * | 6/2008 | Ariga et al. .................... | 320/125 |
| 7,400,149 B2 | * | 7/2008 | Koster et al. .................. | 324/429 |
| 7,429,849 B2 | * | 9/2008 | Shoji ............................. | 320/150 |
| 7,554,296 B2 | * | 6/2009 | Mizuno et al. ................ | 320/132 |

(Continued)

FOREIGN PATENT DOCUMENTS
JP          06-242195          9/1994
(Continued)

*Primary Examiner* — Carol S Tsai
(74) *Attorney, Agent, or Firm* — Oblon, Spivak, McClelland, Maier & Neustadt, L.L.P.

(57) ABSTRACT

A method and apparatus is used to confirm the charge amount and degradation state of a battery. Various cycle test battery measurements are conducted at prescribed time intervals until the end of the battery life, and the measured values are used to generate a determination table or determination tables showing relationships between battery charge amount and degradation state. To establish the charge amount and degradation state of a subject battery, the subject battery is measured and the results compared with determination table values. The existing charge amount and the state of battery degradation are estimated in accordance with a determination table location of matching values.

13 Claims, 10 Drawing Sheets

U.S. PATENT DOCUMENTS 7,710,119 B2 * 5/2010 Bertness .................. 324/426

FOREIGN PATENT DOCUMENTS

| JP | 10-142302 | 5/1998 |
| --- | --- | --- |
| JP | 11-14718 | 1/1999 |
| JP | 11-16607 | 1/1999 |
| JP | 11-133122 | 5/1999 |
| JP | 2001-51029 | 2/2001 |
| JP | 2002-345158 | 11/2002 |

* cited by examiner

F I G. 8
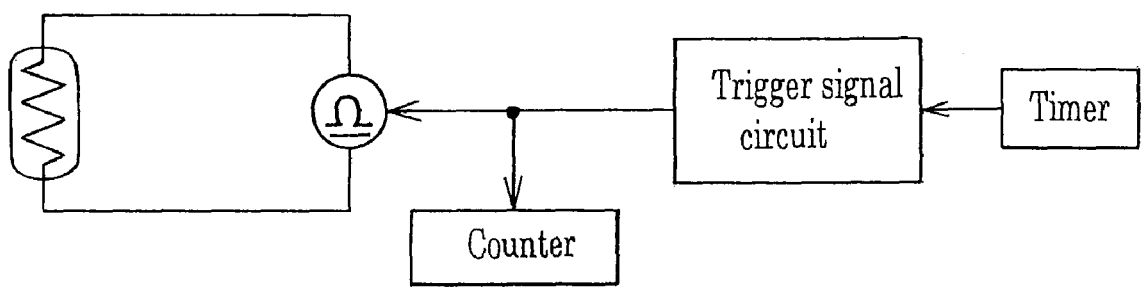

FIG. 10

[A_AVE] determination table (Table 1)

| Table-1 | | RSOC | | | | |
|---|---|---|---|---|---|---|
| | CYC | 80%≦RSOC | 60%≦RSOC <80% | 40%≦RSOC <60% | 20%≦RSOC <40% | 0%≦RSOC <20% |
| Tavg<10℃ | 90%≦ CYC | 4.1 ~ 4.15 | 3.9 ~ 4.10 | 3.7 ~ 3.9 | 3.4 ~ 3.7 | 0 ~ 3.4 |
| | 80%≦CYC <90% | 4.1 ~ 4.15 | 3.9 ~ 4.10 | 3.7 ~ 3.9 | 3.4 ~ 3.7 | 0 ~ 3.4 |
| | 70%≦CYC <80% | 4.05 ~ 4.1 | 3.9 ~ 4.05 | 3.6 ~ 3.9 | 3.2 ~ 3.6 | 0 ~ 3.2 |
| | 60%≦CYC <70% | 4.05 ~ 4.1 | 3.9 ~ 4.05 | 3.6 ~ 3.8 | 3.2 ~ 3.6 | 0 ~ 3.2 |
| | 50%≦CYC <60% | 4.0 ~ 4.05 | 3.6 ~ 4.00 | 3.3 ~ 3.6 | 3.1 ~ 3.3 | 0 ~ 3.1 |
| | 40%≦CYC <50% | 3.95 ~ 4.0 | 3.4 ~ 3.95 | 3.2 ~ 3.4 | 3.0 ~ 3.2 | 0 ~ 3.0 |
| | 0%≦CYC <40% | 3.85 ~ 3.95 | 3.3 ~ 3.85 | 3.2 ~ 3.3 | 2.8 ~ 3.2 | 0 ~ 2.8 |
| Tavg≧10℃ Tavg≦40℃ | 90%≦ CYC | 4.15 ~ 4.2 | 3.9 ~ 4.15 | 3.7 ~ 3.9 | 3.4 ~ 3.7 | 0 ~ 3.4 |
| | 80%≦CYC <90% | 4.10 ~ 4.15 | 3.9 ~ 4.10 | 3.7 ~ 3.9 | 3.4 ~ 3.7 | 0 ~ 3.4 |
| | 70%≦CYC <80% | 4.05~ 4.10 | 3.9 ~ 4.05 | 3.6 ~ 3.9 | 3.2 ~ 3.6 | 0 ~ 3.2 |
| | 60%≦CYC <70% | 4.05 ~ 4.10 | 3.8 ~ 4.05 | 3.6 ~ 3.8 | 3.2 ~ 3.6 | 0 ~ 3.2 |
| | 50%≦CYC <60% | 4.00 ~ 4.05 | 3.6 ~ 4.00 | 3.3 ~ 3.6 | 3.1 ~ 3.3 | 0 ~ 3.1 |
| | 40%≦CYC <50% | 3.95 ~ 4.00 | 3.4 ~ 3.95 | 3.2 ~ 3.4 | 3.0 ~ 3.2 | 0 ~ 3.0 |
| | 0%≦CYC <40% | 3.85 ~ 3.95 | 3.3 ~ 3.85 | 3.2 ~ 3.3 | 2.8 ~ 3.2 | 0 ~ 2.8 |
| Tavg>40℃ | 90%≦ CYC | 4.10 ~ 4.15 | 3.9 ~ 4.10 | 3.7 ~ 3.9 | 3.4 ~ 3.7 | 0 ~ 3.4 |
| | 80%≦CYC <90% | 4.10 ~ 4.15 | 3.9 ~ 4.10 | 3.7 ~ 3.9 | 3.4 ~ 3.7 | 0 ~ 3.4 |
| | 70%≦CYC <80% | 4.05 ~ 4.10 | 3.9 ~ 4.05 | 3.6 ~ 3.9 | 3.2 ~ 3.6 | 0 ~ 3.2 |
| | 60%≦CYC <70% | 4.05 ~ 4.10 | 3.8 ~ 4.05 | 3.6 ~ 3.8 | 3.2 ~ 3.6 | 0 ~ 3.2 |
| | 50%≦CYC <60% | 4.00 ~ 4.05 | 3.6 ~ 4.00 | 3.3 ~ 3.6 | 3.1 ~ 3.3 | 0 ~ 3.1 |
| | 40%≦CYC <50% | 3.95 ~ 4.00 | 3.4 ~ 3.95 | 3.2 ~ 3.4 | 3.0 ~ 3.2 | 0 ~ 3.0 |
| | 0%≦CYC <40% | 3.85 ~ 3.95 | 3.3 ~ 3.85 | 3.2 ~ 3.3 | 2.8 ~ 3.2 | 0 ~ 2.8 |

METHOD AND APPARATUS FOR CONFIRMING THE CHARGE AMOUNT AND DEGRADATION STATE OF A BATTERY, A STORAGE MEDIUM, AN INFORMATION PROCESSING APPARATUS, AND AN ELECTRONIC APPARATUS

CROSS-REFERENCE TO RELATED APPLICATIONS

This application is a Divisional of U.S. patent application Ser. No. 10/721,464, filed Nov. 26, 2003, which is based on Japanese Patent Application No. 2001-145591, filed May 15, 2001. The contents of U.S. patent application Ser. No. 10/721,464 are incorporated herein by reference in their entirety.

BACKGROUND OF THE INVENTION

1. Field of the Invention

The present invention relates to a method and apparatus for confirming the charge amount and degradation state of a battery, a storage medium, an information processing apparatus and an electronic apparatus that, based on a battery's charge and discharge characteristics, enables the charge amount and degradation state of the battery to quickly be estimated. The "battery" as used herein encompasses batteries that include various active materials and/or rated voltages that can be repeatedly charged and discharged.

2. Description of the Prior Art

To some degree, a battery has the property of reverting to its original charge amount when discharge is halted. This has made it difficult to estimate accurately the charge amount and degradation state of a battery by simply measuring the battery voltage and discharge current. If it is known that the discharge voltage and current are extremely weak, it can be determined that the battery is at the end of its life. In general, in the case of batteries used in electric equipment, the discharge voltage and/or the discharge current is measured, and if it is found to have fallen below a certain level, that fact is shown on the LCD display of the equipment as a prompt to replace the battery. The life of a battery can be estimated to some extent by measuring the capacity of a battery that has been charged and/or discharged for an extended period (around one or two hours).

However, since a battery uses chemical reactions to generate electricity, batteries having the same active material or rating can have different charge amounts and degradation state at any particular time, depending on the state in which each battery is kept and used, and the temperature and other environmental factors. As a result, even if the LCD display indicates that a battery has around half its charge or is half degraded, it is not unusual for the battery to suddenly become unusable. It has therefore been considered that it is not possible to display accurately, in a short time, the remaining charge and the degradation state of a battery.

This inability to accurately gauge the remaining charge and degradation state of a battery has made it difficult to determine whether a battery is new or is one that has been repeatedly charged and discharged. Moreover, new batteries sometimes include ones that are degraded and have only a small charge amount, even after being charged. If someone with bad intentions buys a battery and repeatedly charges and discharges it, then tells the seller that it is defective although in fact it has just been degraded, the seller finds it difficult to refute the claim.

An object of the present invention is therefore to provide a method and apparatus for confirming the charge amount and degradation state of a battery, a storage medium, an information processing apparatus, and an electronic apparatus that, by measuring different charge and discharge characteristics at a plurality of time points over a short time period, make it possible to stochastically measure the remaining charge amount and degradation state of the battery substantially accurately.

SUMMARY OF THE INVENTION

To attain the object, the invention provides a method of confirming battery charge amount and degradation state comprising the steps of measuring at a plurality of battery temperatures a cycle test battery in respect of one selected from battery open voltage, current and voltage during discharge, and current and voltage during charging at predetermined time intervals substantially until battery end of life, using measured values to generate a determination table showing relationships between prescribed charge amounts and prescribed degradation states, measuring a subject battery in respect of the same one selected from battery open voltage, current and voltage during discharge, and current and voltage during charging, and comparing determination table values with a measured value of the subject battery to confirm present subject battery charge amount and degradation state according to a determination table location where the values match.

The invention also provides a method of confirming battery charge amount and degradation state comprising the steps of measuring at a plurality of battery temperatures a cycle test battery using measurements of at least two selected from battery open voltage, current and voltage during discharge, and current and voltage during charging at predetermined time intervals substantially until battery end of life, using measured values to generate determination tables showing relationships in each case between prescribed charge amounts and prescribed degradation states, measuring a subject battery in respect of said at least two selected from battery open voltage, current and voltage during discharge, and current and voltage during charging, and comparing determination table values with each of measured values of the subject battery to confirm present subject battery charge amount and degradation state according to determination table locations of matching values, and simultaneously using an incidence of appearance at the determination locations resulting from the measured values to estimate present subject battery charge amount and degradation state.

The method includes using as the battery open voltage, the average value of the measurements made at fixed time intervals. The method also includes measuring the voltage and current during discharge in a constant current discharge circuit by measuring the battery voltage and then, after discharge starts, measuring the battery voltage a plurality of times at fixed time intervals while simultaneously measuring the discharge current a plurality of times at fixed time intervals. The discharge is then stopped and the battery voltage is measured a plurality of times at fixed time intervals.

The method also includes measuring the battery voltage and current, and the time, in a constant current, constant voltage discharge circuit, by measuring the battery voltage, subtracting a predetermined voltage from the measured battery voltage to set a constant voltage discharge value, measuring how much time elapses from the start of discharge until the set constant voltage discharge value is attained, and, after the discharge is started, measuring discharge current a plurality of times at fixed time intervals, then terminating the discharge.

The method also includes measuring the current and voltage during constant current charging by measuring the battery voltage, starting the charging, measuring the battery voltage when the charge current is changed a plurality of times at fixed time intervals, and terminating the charging.

The method also includes measuring the current and voltage during constant current, constant voltage charging by measuring the battery voltage, adding a predetermined voltage to the measured battery voltage to set a constant voltage charging value, starting the charging, measuring a time at which the set constant voltage charging value is reached, measuring the charge current a plurality of times at fixed time intervals, and terminating the charging.

The ambient temperatures during measurements of the cycle test battery for creating the determination tables, and during measurement of the subject battery, are measured a plurality of times at fixed time intervals.

The invention also provides, in an apparatus that confirms battery charge amount and degradation state in which values of a determination table showing relationships between prescribed charge amounts and prescribed degradation states based on measurements, at a plurality of battery temperatures, of a cycle test battery in respect of one selected from battery open voltage, current and voltage during discharge, and current and voltage during charging at predetermined time intervals substantially until battery end of life, and a measured value of a subject battery in respect of the same one selected from battery open voltage, current and voltage during discharge, and current and voltage during charging, are compared and present subject battery charge amount and degradation state are confirmed according to a determination table location of matching values, an apparatus for measuring the open voltage of a battery, comprising at least a trigger signal circuit that generates a signal at fixed time intervals to operate a voltmeter, a timer for setting a time interval at which the trigger signal circuit generates the signal, and a counter for pre-setting a number of times the trigger signal circuit generates the signal.

The invention also provides, in an apparatus that confirms battery charge amount and degradation state in which values of a determination table showing relationships between prescribed charge amounts and prescribed degradation states based on measurements, at a plurality of battery temperatures, of a cycle test battery in respect of one selected from battery open voltage, current and voltage during discharge, and current and voltage during charging at predetermined time intervals substantially until battery end of life, and a measured value of a subject battery in respect of the same one selected from battery open voltage, current and voltage during discharge, and current and voltage during charging, are compared and present subject battery charge amount and degradation state are confirmed in accordance with a determination table location of matching values, an apparatus for measuring battery current, voltage during discharge, comprising at least a trigger signal circuit that generates a signal at fixed time intervals to operate a voltmeter and an ammeter, a pulse-discharge generation circuit that discharges a battery at fixed time intervals, a timer for setting time intervals at which the trigger signal circuit generates the signal and the pulse-discharge generation circuit discharges the battery, and a counter for pre-setting a number of times the trigger signal circuit generates the signal and the pulse-discharge generation circuit discharges the battery.

The invention also provides, in an apparatus that confirms battery charge amount and degradation state in which values of a determination table showing relationships between prescribed charge amounts and prescribed degradation states based on measurements, at a plurality of battery temperatures, of a cycle test battery in respect of one selected from battery open voltage, current and voltage during discharge, and current and voltage during charging at predetermined time intervals substantially until battery end of life, and a measured value of a subject battery in respect of the same one selected from battery open voltage, current and voltage during discharge, and current and voltage during charging, are compared and present subject battery charge amount and degradation state are confirmed in accordance with the a determination table location of matching values, an apparatus for measuring constant current, constant voltage discharge of a battery, comprising at least a trigger signal circuit that generates a signal at fixed time intervals to operate a voltmeter and an ammeter, a constant current, constant voltage discharge circuit that discharges a battery at fixed time intervals, a timer for setting the time intervals at which the trigger signal circuit the signal and the constant current, constant voltage discharge circuit discharges the battery, a counter for pre-setting the number of times the trigger signal circuit the signal and the constant current, constant voltage discharge circuit discharges the battery, and a time-measurement circuit for measuring the time from the start of discharge to a set fall in voltage.

The invention also provides, in an apparatus that confirms battery charge amount and degradation state in which values of a determination table showing relationships between prescribed charge amounts and prescribed degradation states based on measurements, at a plurality of battery temperatures, of a cycle test battery in respect of one selected from battery open voltage, current and voltage during discharge, and current and voltage during charging at predetermined time intervals substantially until battery end of life, and a measured value of a subject battery in respect of the same one selected from battery open voltage, current and voltage during discharge, and current and voltage during charging, are compared and present subject battery charge amount and degradation state are confirmed in accordance with a determination table location of matching values, an apparatus for measuring current and voltage during battery charging, comprising at least a trigger signal circuit that generates a signal at fixed time intervals to operate a voltmeter and an ammeter, a constant current, constant voltage charging circuit that charges a battery at fixed time intervals, a timer for setting the time intervals at which the trigger signal circuit generates the signal and the constant current, constant voltage charging circuit charges the battery, and a counter for pre-setting the number of times the trigger signal circuit the signal and the constant current, constant voltage charging circuit charges the battery.

The invention also provides, in an apparatus that confirms battery charge amount and degradation state in which values of a determination table showing relationships between prescribed charge amounts and prescribed degradation states based on measurements, at a plurality of battery temperatures, of a cycle test battery in respect of one selected from battery open voltage, current and voltage during discharge, and current and voltage during charging at predetermined time intervals substantially until battery end of life, and a measured value of a subject battery in respect of the same one selected from battery open voltage, current and voltage during discharge, and current and voltage during charging, are compared and present subject battery charge amount and degradation state are confirmed in accordance with a determination table location of matching values, an apparatus for measuring constant current, constant voltage charging of a battery, comprising at least a time-measurement circuit for measurement of time from start of charging to a set rise in voltage, a trigger signal circuit that generates a signal at fixed time intervals to operate a voltmeter, an ammeter and the time-measurement circuit, a constant current, constant voltage charging circuit that charges a battery at fixed time intervals, a timer for setting time intervals at which the trigger signal circuit generates the signal and the constant current, constant voltage charging circuit charges the battery, and a counter for pre-setting the number of times the trigger signal circuit generates the signals and the constant current, constant voltage charging circuit charges the battery.

The invention also provides, in an apparatus that confirms battery charge amount and degradation state in which values of a determination table showing relationships between prescribed charge amounts and prescribed degradation states based on measurements, at a plurality of battery temperatures, of a cycle test battery in respect of one selected from battery open voltage, current and voltage during discharge, and current and voltage during charging at predetermined time intervals substantially until battery end of life, and a measured value of a subject battery in respect of the same one selected from battery open voltage, current and voltage during discharge, and current and voltage during charging, are compared and present subject battery charge amount and degradation state are confirmed in accordance with a determination table location of matching values, a thermistor apparatus for measuring the internal and surface temperatures of a battery located in proximity to the thermistor apparatus, comprising at least a trigger signal circuit that generates a signal at fixed time intervals to operate a resistance meter, a timer for setting time intervals at which the trigger signal circuit generates the signal, and a counter for pre-setting the number of times the trigger signal circuit generates the signal.

The invention also provides a storage medium in which are stored a program of the above-described method, and the determination table or tables.

The invention also provides an information processing apparatus that uses the Internet to download a program of the method, together with determination table data. The information processing apparatus includes one that includes a read-only memory (ROM) containing the program of the method and the determination table data.

The invention also provides an electronic apparatus that includes a ROM containing the program of the method and the determination table data.

Thus, as described in the foregoing, in accordance with this invention, confirmation of battery charge amount and degradation state is effected by measuring a cycle test battery at predetermined time intervals substantially until the battery end of life, using determination table or tables showing the relationships between prescribed charge amounts and prescribed degradation states as a basis for predicting the amount of the charge in a battery and estimating the battery's degradation state. Therefore, with one measurement, it is possible to stochastically establish the remaining charge amount and the degradation state of the battery substantially accurately.

Further features of the invention, its nature and various advantages will be more apparent from the accompanying drawings and following detailed description of the invention.

BRIEF DESCRIPTION OF THE DRAWINGS

FIG. 8 is a diagram of a circuit for measuring the internal and surface temperature of a battery, according to the invention.

FIG. 10 is a diagram for explaining an open voltage determination table of the invention, generated using the results of open voltage measurements.

DESCRIPTION OF THE PREFERRED EMBODIMENTS

Figure 1:
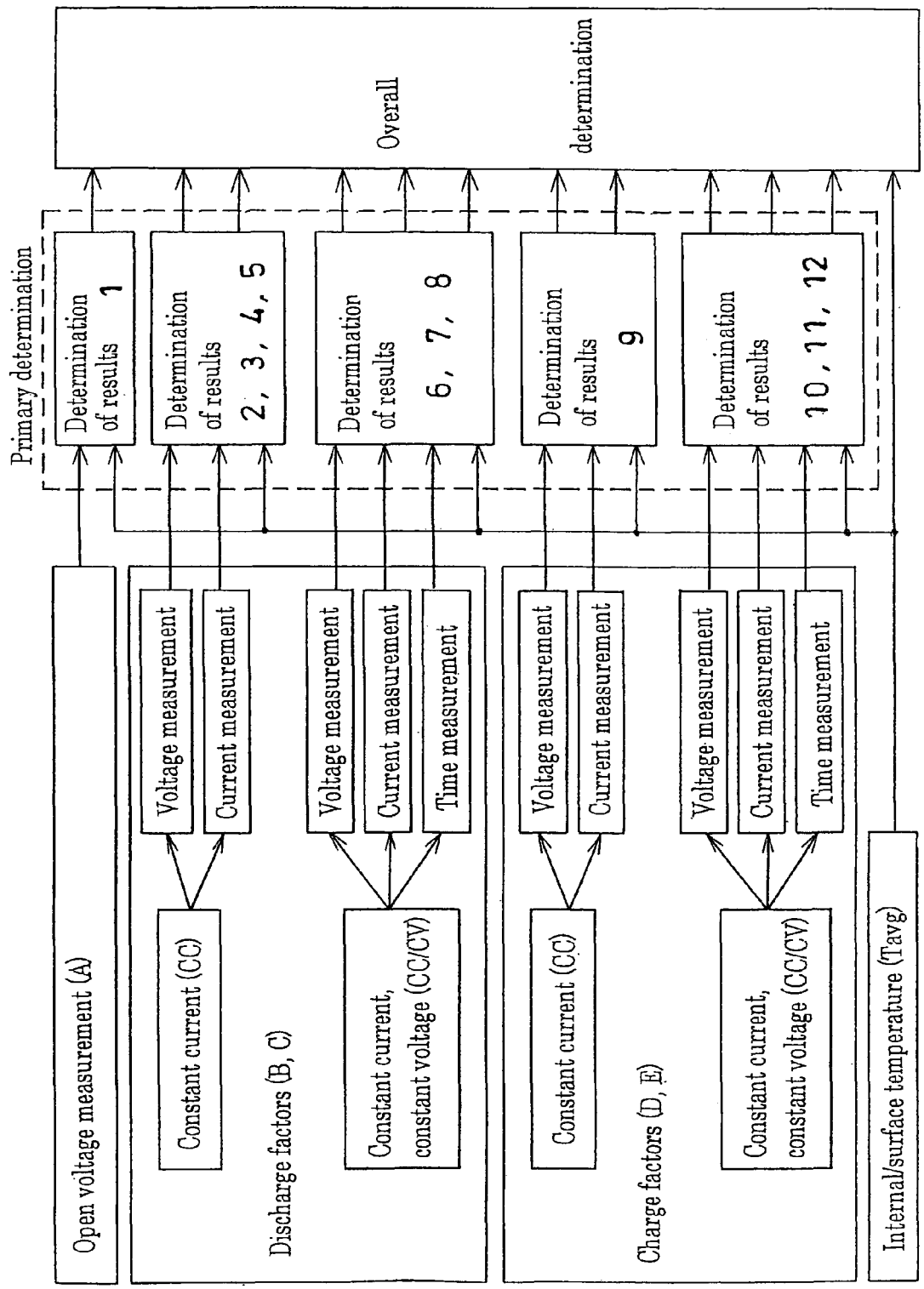
FIG. 1 is a block diagram illustrating the general configuration used for confirming the current amount of charge and degradation state of a battery, in accordance with an embodiment of the present invention.

The invention provides a method for confirming the charge amount and degradation state of a battery in which the battery's charge and discharge characteristics can be used to predict the battery's present charge amount and to estimate its degradation state. First, at a plurality of low, ordinary and high temperatures, a cycle test battery is repeatedly measured in respect of one selected from battery open voltage, current, voltage during discharge, and current, voltage during charging at predetermined time intervals substantially until the end of the life of the battery.

The measured values thus obtained are used to generate determination tables of relationships between prescribed charge amounts (for example, charge amounts ranging from 0% to 100% at 10° C. to 40° C.) and prescribed degradation states (for example, degradation states ranging from 0% to 100% at 10° C. to 40° C.). That is, in the determination table, for each temperature range (low, normal, high), the measurement results are arranged in a matrix that shows the charge amount along the X-axis and the degradation state along the Y-axis.

Next comes a measurement of the open voltage, current, voltage during discharge, or current, voltage during charging of a subject battery at a low, normal or high temperature; this is a single measurement, made using the same method. The measured value is then compared with the determination table values. This makes it possible, with just one measurement, to predict the present charge amount and to estimate the degradation state of the battery according to the location of the matching values in the determination table. Since the determination table values are actual measured values, the same numerical values appear in a plurality of locations.

While the above description is made with reference to selecting just one among open voltage, current, voltage during discharge, and current, voltage during charging, the invention is not limited thereto. Instead, two or more may be selected for measurement and the results similarly compared with determination table values. That is, with respect to the cycle test battery, at least two measurement methods may be selected from among open voltage, current, voltage during discharge, and current, voltage during charging, and implemented at predetermined time intervals substantially until the end of the battery life, and the values thus obtained used to generate determination tables. The same measurement is conducted once on the subject battery and the result compared with the values in the determination table generated using the data obtained by the above measurement methods.

Based on the locations of matching values in the determination table, the present charge amount and degradation state of the battery can be confirmed, in addition to which the incidence of the measured value locations in the determination table enables the present charge amount of the subject battery to be predicted and the degradation state estimated in just a short time. If, for example, there is one 80% charge location, two 70% charge locations and three 20% degradation locations, the charge amount is 75% (more precisely, 73.33.%) and the degradation is 20%. Accuracy can be increased by increasing the types of measurement method, and by using determination table locations to calculate probabilities.

The method also comprises measuring the battery open voltage a plurality of times at fixed time intervals and dividing the results by the number of measurements to obtain an average value. The time required to predict the remaining charge and estimate the degradation can be shortened depending on where in the determination table the average value is located.

The method also comprises measuring the voltage and current during discharge in a constant current discharge circuit by measuring the battery voltage, and then, after discharge starts, measuring the battery voltage a plurality of times at fixed time intervals while simultaneously measuring the discharge current a plurality of times at fixed time intervals. Then, after stopping the discharge, the battery voltage is measured a plurality of times at fixed time intervals.

The method also comprises measuring the battery voltage in a constant current, constant voltage discharge circuit, and subtracting from the measured battery voltage a voltage that is predetermined according to the battery type and rated voltage to set a constant voltage discharge value. Discharge is then started, and the time from the start of discharge until the set constant voltage discharge value is attained is measured. Starting from the initiation of the discharge, the discharge current is measured a plurality of times at fixed time intervals, after which the discharging is terminated.

The method also comprises measuring the battery voltage and current when the charge current is changed a plurality of times at fixed time intervals, with the current and voltage being measured each time, after which the charging is terminated.

The method also comprises measurement of the current and voltage during constant current, constant voltage charging by adding to the battery voltage a voltage that is predetermined according to battery type and rated voltage to set a constant voltage charging value. Charging is then started, and the time from the start of the charging until the set constant voltage charging value is attained is measured. The charge current is measured a plurality of times at fixed time intervals, and charging is then terminated.

Although in the foregoing the method is described only with reference to a subject battery, cycle test battery measurement, the same kind of method is used to measure cycle test batteries until the battery end of life, and the results are used to generate determination tables. The ambient temperatures during cycle test battery measurements for creating the determination tables, and measurement of the subject battery, are measured a plurality of times at fixed time intervals.

The invention also provides an apparatus that confirms a battery charge amount and degradation state, based on the above method. The apparatus includes a voltmeter, a trigger signal circuit and a timer. The voltmeter is connected to a cycle test battery or subject battery in an open state.

The trigger signal circuit is connected to the voltmeter, which is operated by a signal generated by the trigger signal circuit at fixed time intervals. The timer sets the fixed time intervals at which the signal is generated by the trigger signal circuit. A counter can be provided to pre-set the number of times the signal is generated by the trigger signal circuit.

Thus, the apparatus measures the open voltage of a cycle test battery or subject battery at fixed time intervals set by the timer, and conducts the measurement the number of times set by the counter. The simple circuit configuration enables the apparatus to be made very small.

The apparatus also comprises a voltmeter, an ammeter, a trigger signal circuit, a timer, a counter and a pulse-discharge generation circuit. The voltmeter and ammeter are connected to a cycle test battery or subject battery for measurements. To measure the battery current, voltage during discharge, the trigger signal circuit operates the voltmeter and ammeter by generating a signal at fixed time intervals.

The pulse-discharge generation circuit generates a signal to discharge the battery at fixed time intervals. a timer for setting time intervals at which signals are generated by the trigger signal circuit and the pulse-discharge generation circuit, and a counter for pre-setting a number of times the signals are generated by the trigger signal circuit and the pulse-discharge generation circuit. The timer sets the fixed time intervals at which signals are generated by the trigger signal circuit and the pulse-discharge generation circuit.

The counter is used to pre-set the number of times the signals are generated by the trigger signal circuit and the pulse-discharge generation circuit. This configuration thereby makes it possible to measure the battery voltage and discharge current of a cycle test battery or subject battery at fixed time intervals.

The apparatus also comprises a voltmeter, an ammeter, a trigger signal circuit, a timer, a counter, a constant current, constant voltage discharge circuit and a time measurement circuit. The voltmeter and ammeter are connected to a cycle test battery or subject battery for the measurements. To measure the constant current, constant voltage discharge of the battery, a signal to operate the voltmeter and ammeter is generated at fixed time intervals by the trigger signal circuit. The timer is used to set the fixed time intervals at which signals are generated by the constant current, constant voltage discharge circuit. The counter is used to pre-set the number of times signals are generated by the trigger signal circuit and the constant current, constant voltage discharge circuit. The constant current, constant voltage discharge circuit is controlled by means of the timer and the counter to discharge the battery at the fixed time intervals. The time measurement circuit measures the time from when the discharge is started by the trigger signal circuit until there is a set fall in the voltage.

The apparatus also comprises a voltmeter, an ammeter, a trigger-signal circuit, a timer, a counter and a constant current, constant voltage charging circuit. The voltmeter and ammeter are connected to a cycle test battery or subject battery for the measurements. To measure the constant current, constant voltage charging of the battery, a signal to operate the voltmeter and ammeter is generated at fixed time intervals by the trigger signal circuit. The constant current, constant voltage charging circuit charges the battery at fixed time intervals. The timer is used to set the fixed time intervals at which signals are generated by the trigger signal circuit and the constant current, constant voltage charging circuit. The counter is used to pre-set the number of times the signals are generated by the trigger signal circuit and the constant current, constant voltage charging circuit.

The apparatus also comprises a voltmeter, an ammeter, a trigger-signal circuit, a timer, a counter, a constant current, constant voltage charging circuit and a time measurement circuit. The voltmeter and ammeter are connected to a cycle test battery or subject battery for the measurements. The time measurement circuit measures the time from the start of the discharge to a set rise in the voltage. The voltmeter, ammeter and time measurement circuit are operated by a signal generated at fixed time intervals by the trigger signal circuit. The constant current, constant voltage charging circuit charges the battery at the fixed time intervals. The timer is used to set the fixed time intervals at which signals are generated by the trigger signal circuit and the constant current, constant voltage charging circuit, and the counter is used to pre-set the number of times the signals are generated by the trigger signal circuit and the constant current, constant voltage charging circuit.

The apparatus also includes a thermistor located in proximity to the cycle test battery or subject battery. The thermistor can, for example, be affixed to the battery surface with an adhesive. The apparatus for measuring the internal and external temperature of the battery comprises a trigger signal circuit that operates a resistance meter by generating a signal at fixed time intervals, a timer for setting the time intervals at which the signals are generated by the trigger signal circuit, and a counter for pre-setting the number of times the signals are generated by the trigger signal circuit. Thus, the trigger signal circuit operates the resistance meter by generating a signal at fixed time intervals, the timer sets the time intervals at which the signals are generated by the trigger signal circuit, and the counter sets the number of times the signals are generated by the trigger signal circuit.

Regarding the measuring for confirming battery charge amount and degradation state, measurements on the cycle test battery are run until the battery end of life. The subject battery is measured a plurality of times; increasing the number of measurements improves the accuracy. To generate determination tables, measurements on cycle test batteries are conducted at low, normal and high temperatures, and measurement results from a subject battery are compared with the table data in the temperature category corresponding to the temperature at which the subject battery measurements were made.

The storage medium according to the invention is used to store a program of the method of confirming battery charge amount and degradation state, and determination table data on which are based determinations relating to charge amount and degradation state of a subject battery. The storage medium, sold or provided by battery retailers, can be used to readily predict the current battery charge amount and estimate the degradation state of the battery.

The information processing apparatus according to the invention uses the Internet to download a program of the method of confirming battery charge amount and degradation state, together with determination table data on which are based determinations relating to charge amount and degradation state of a subject battery. Vendors can use their own information processing systems to download the program and data to thereby provide a more suitable service. The information processing apparatus can be one that includes a ROM containing the method program and determination table data.

The electronic apparatus according to the invention includes a ROM containing the program of the method of confirming battery charge amount and degradation state, together with determination table data on which are based determinations relating to charge amount and degradation state of a subject battery. A portable such apparatus can be used that is provided with the ROM to enable present charge amount and degradation state to be shown on the display of the apparatus.

The method of confirming battery charge amount and degradation state will now be described with reference to the drawings.

FIG. 1 is a block diagram illustrating the general configuration for confirming the current amount of charge and degradation state of a battery, in accordance with an embodiment of the present invention. This example is explained with reference to a lithium-ion battery. With reference to FIG. 1, the method of confirming the current battery charge amount and degradation state uses at least one, or a plurality, selected from among measurement A for measuring open voltage, measurement B for measuring constant current discharge characteristics, measurement C for measuring constant current, constant voltage discharge characteristics, measurement D for measuring constant current charging characteristics, and measurement E for measuring constant current, constant voltage charging characteristics. Due to the fact that batteries are comprised of active substances, including chemical substances, measurement T for measuring battery internal and surface temperatures is required.

As described below, measurement A is conducted a plurality of times at fixed time intervals and the results are stored in a temporary storage apparatus (not shown). In order to confirm the discharge state of the battery, constant current discharge mode B is used to measure the battery voltage and battery discharge current, and the results are stored in the temporary storage apparatus. To confirm the degradation state of the battery, constant current, constant voltage discharge mode C is used to measure the battery voltage, battery current, and time, and the results are stored in a temporary storage.

To confirm the charge state of the battery, constant current charging mode D is used to measure the battery voltage and charge current, and the results are temporarily stored.

To confirm the battery charge state, constant current, constant voltage charging mode E is used to measure the battery voltage, battery current, and time, and the results are stored in a temporary storage. Since a battery uses active reactions of chemical substances to generate electricity, measurement T is used to measure the battery internal and surface temperatures, and the results are used as data for an overall determination, described below. The above results are compared with the table data for a primary determination. The primary determination results are subjected to probability calculations, which provide an overall determination that enables the present charge amount and degradation state of the battery to be estimated.

Figure 2:
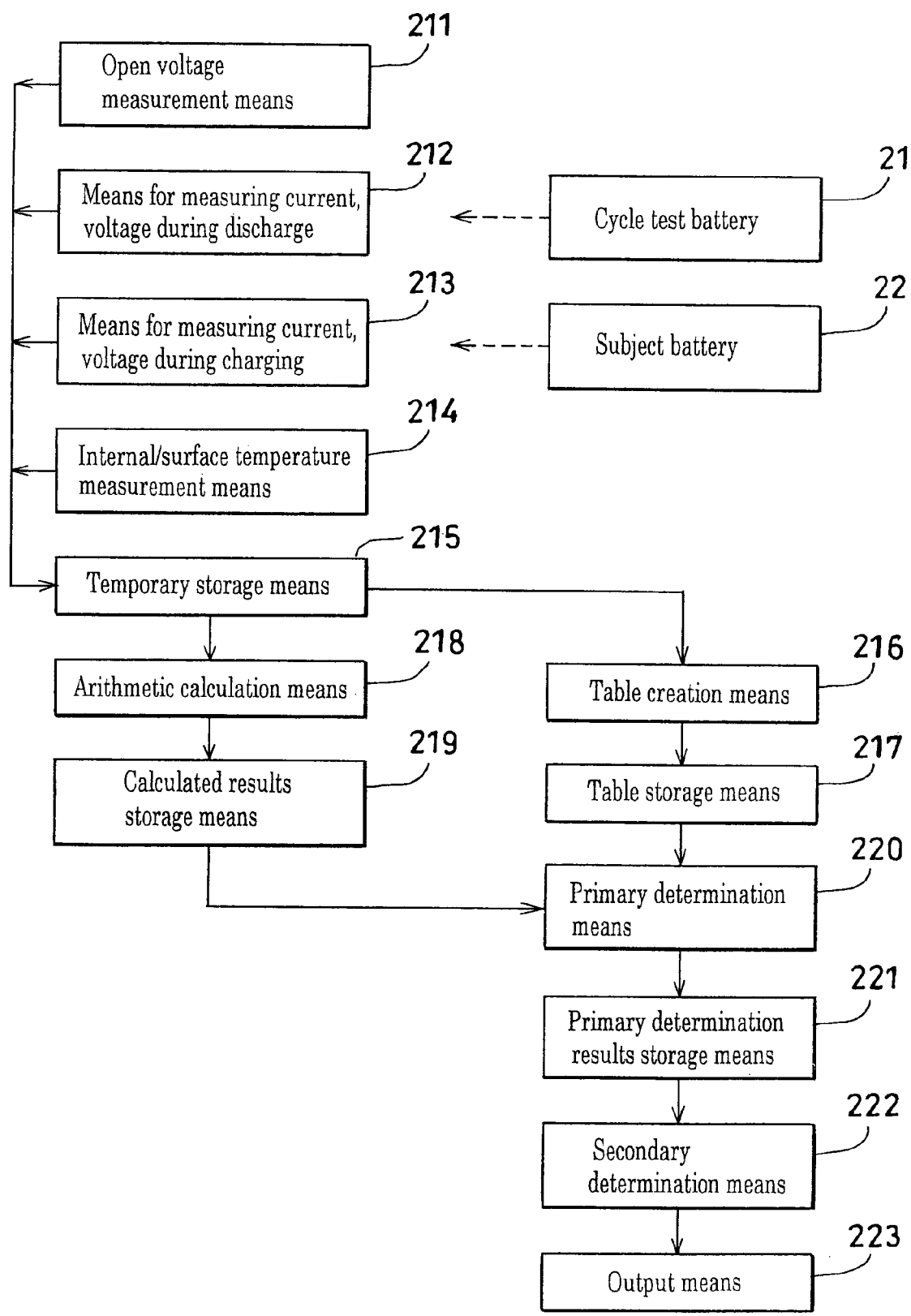
FIG. 2 is a block diagram for explaining details of the embodiment of FIG. 1.

FIG. 2 is a block diagram for explaining details of the embodiment illustrated by FIG. 1. With reference to FIG. 2, a cycle test battery is measured to obtain data used to generate determination tables, or a subject battery is measured. Measurement means 211 is used to measure open voltage, measurement means 212 is used to measure current, voltage during discharge, measurement means 213 is used to current, voltage during charging, and measurement means 214 is used to measure the internal and surface temperatures. Measurement means 211 to 214 are used for measurements of the cycle test battery 21, which continue until the battery's end of life is reached; the measurement results are stored in a temporary storage means 215. The subject battery 22 is measured by each of the measurement means 211 to 214 and the results are stored in the temporary storage means 215.

Figure 3:
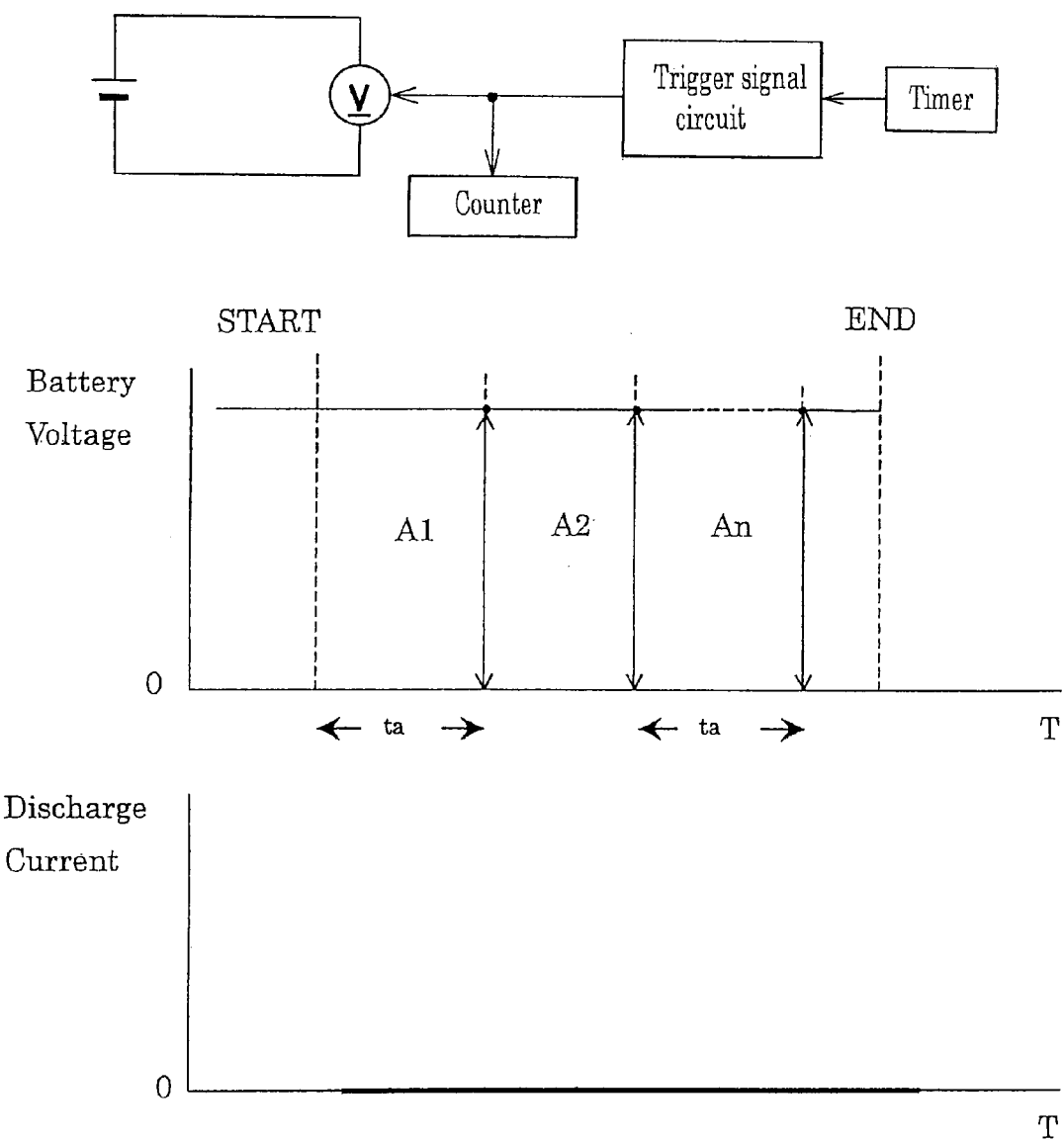
FIG. 3 shows a discharge voltage measuring circuit of the invention, and battery voltage and discharge current.

FIG. 3 shows a discharge voltage measuring circuit of the invention, and battery voltage and discharge current.

As shown in FIG. 3, measurement means 211 uses a voltmeter v to measure the voltage with the battery in an open state, with no load. The measurement is conducted a plurality of times at fixed time intervals. A trigger signal circuit, timer and counter are connected as shown in FIG. 3, to carry out the open voltage measurement n times at the fixed time intervals.

Figure 4:
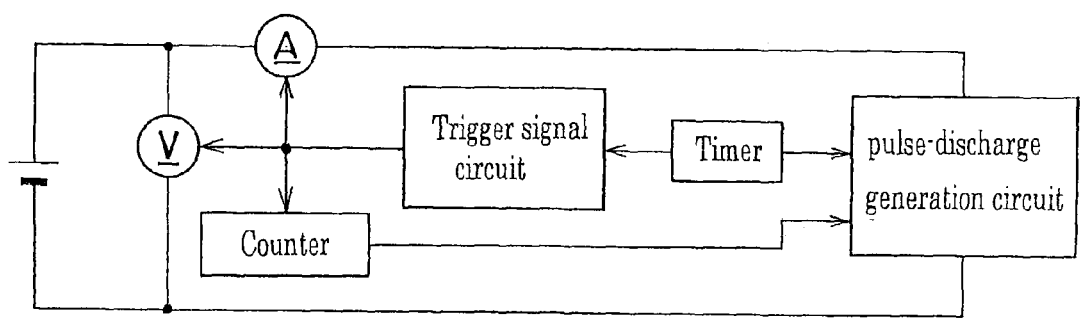
FIG. 4 shows a circuit for measuring current, voltage during discharge according to the invention, and battery voltage and discharge current.
Figure 4:
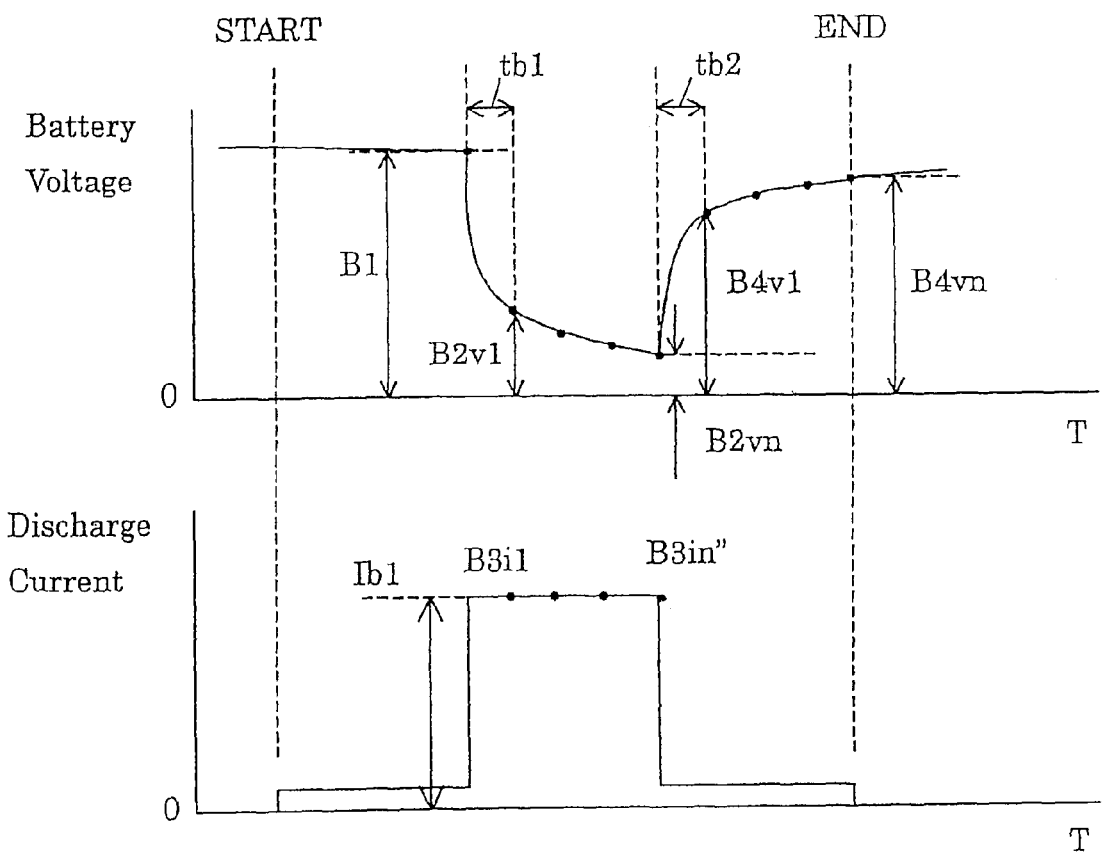

FIG. 4 shows a circuit for measuring current, voltage during discharge according to the invention, and battery voltage and discharge current. The measurement means 212 that is used for this has a voltmeter and ammeter connected to the battery, and to measure the battery voltage a plurality of times at fixed time intervals, a trigger signal circuit, a timer, a counter and a pulse-discharge generation circuit, connected as shown. Voltage B1 of the subject battery is measured. The subject battery is discharged at a fixed time tb1 and the resulting decreased voltage B2$v$1 is measured. The subject battery is thus discharged at fixed time intervals and the resulting voltage B2$v$1, B2$v$2, . . . , B2$vn$ is measured. After the elapse of n fixed time intervals, the subject battery return voltage B4$v$1, B4$v$2, . . . , B4$vn'$ returned at the fixed time intervals is measured. Also measured is the battery discharge current B3$i$1, B3$i$2, . . . , B3$in''$ discharged at the fixed time intervals.

Figure 5:
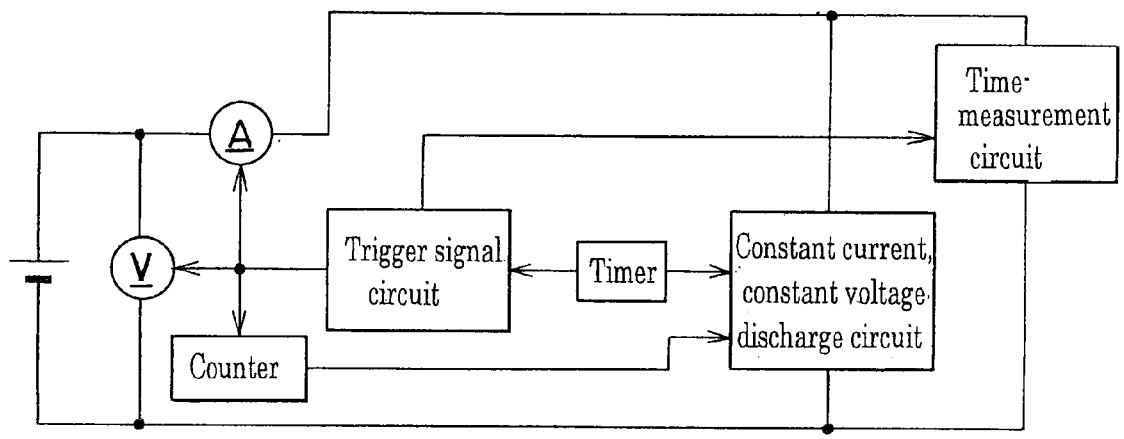
FIG. 5 shows a circuit for measuring current, voltage and time during constant current, constant voltage discharge according to the invention, and battery voltage and discharge current.
Figure 5:
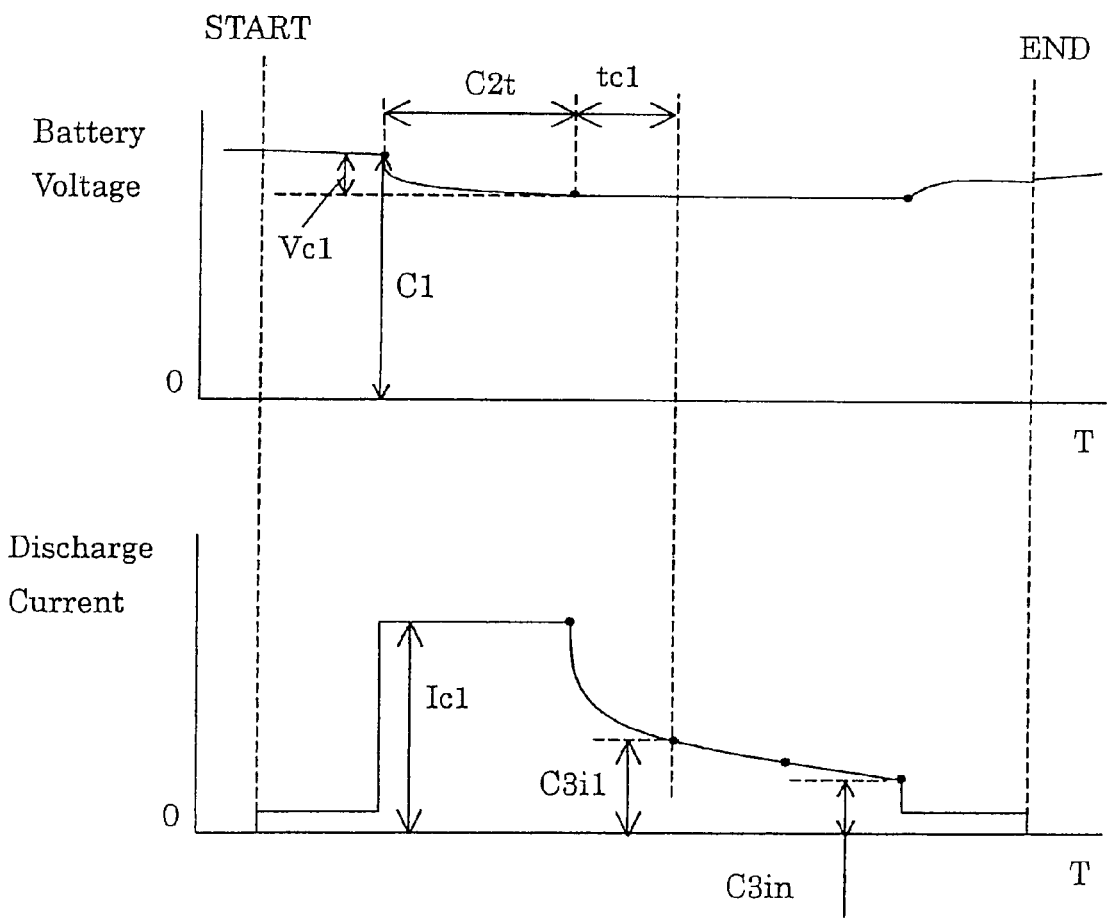

FIG. 5 shows a circuit for measuring current, voltage and time during constant current, constant voltage discharge according to the invention, and battery voltage and discharge current. The measurement means 212 that is used for this has a voltmeter and ammeter connected to the battery, and to measure the battery voltage at fixed time intervals, a trigger signal circuit, a timer, a counter, a constant current, constant voltage discharge circuit and a time measurement circuit, connected as shown. First, voltage C1 of the subject battery is measured. Then, a fixed voltage Vc1 is set that is determined according to the battery type and rated voltage, and the time C2 it takes the subject battery to attain the voltage Vc1 is measured. Starting from the initiation of the discharge, the battery discharge current C3$i$1, C3$i$2, . . . , C3$in$ discharged at fixed time intervals is measured. The time C2 is determined by battery type, rated voltage, and so forth.

Figure 6:
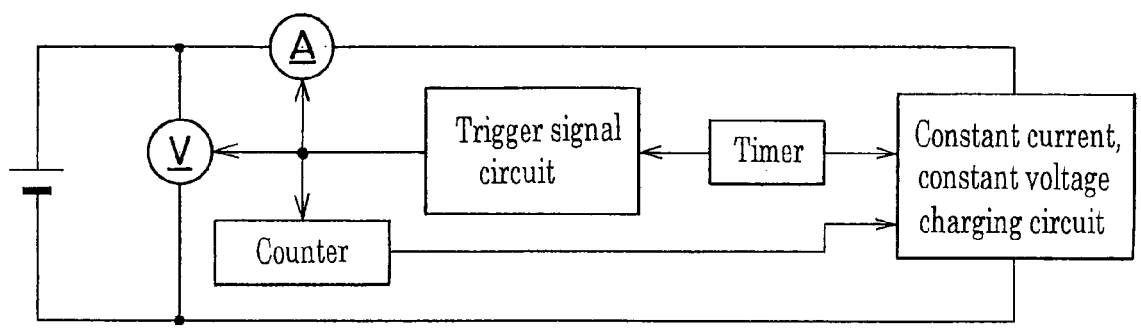
FIG. 6 shows a circuit for measuring current and voltage during constant current, constant voltage charging according to the invention, and battery voltage and charge current.
Figure 6:
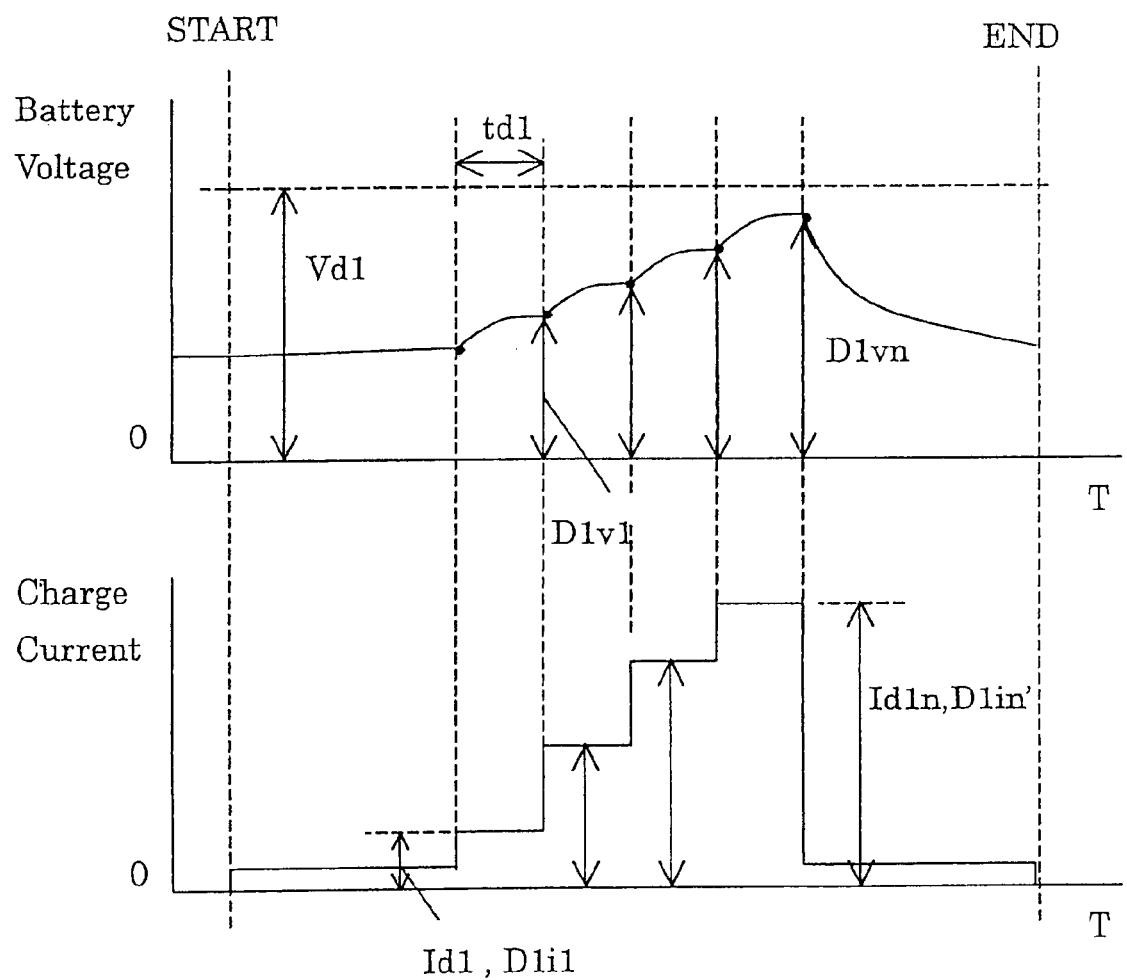

FIG. 6 shows a circuit for measuring current and voltage during constant current, constant voltage charging according to the invention, and battery voltage and charge current. The measurement means 213 that is used for this has a voltmeter and ammeter connected to the battery, and to measure the battery charge voltage at fixed time intervals, a trigger signal circuit, a timer, a counter and a constant current, constant voltage charging circuit, connected as shown. First, voltage Vd1 of the subject battery is measured. This is followed by measurement of charge voltage D1$v$1, D1$v$2, . . . , D1$vn$ charged at a fixed time interval td1 that is determined according to the battery type and rated voltage. Also measured is the charge current D2$i$1, D2$i$2, . . . , D2$in'$ flowing in the subject battery.

Figure 7:
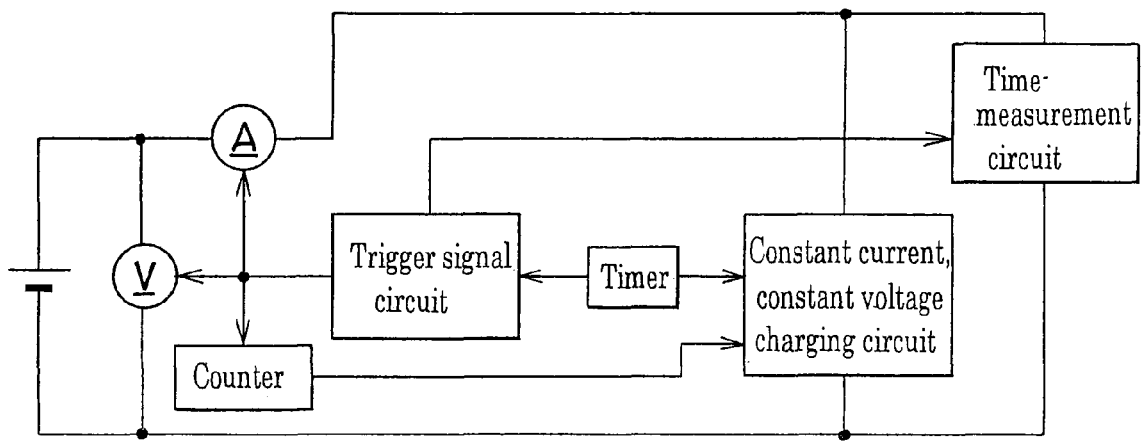
FIG. 7 shows a circuit for measuring current, voltage and time during constant current, constant voltage charging according to the invention, and battery charge voltage and charge current.
Figure 7:
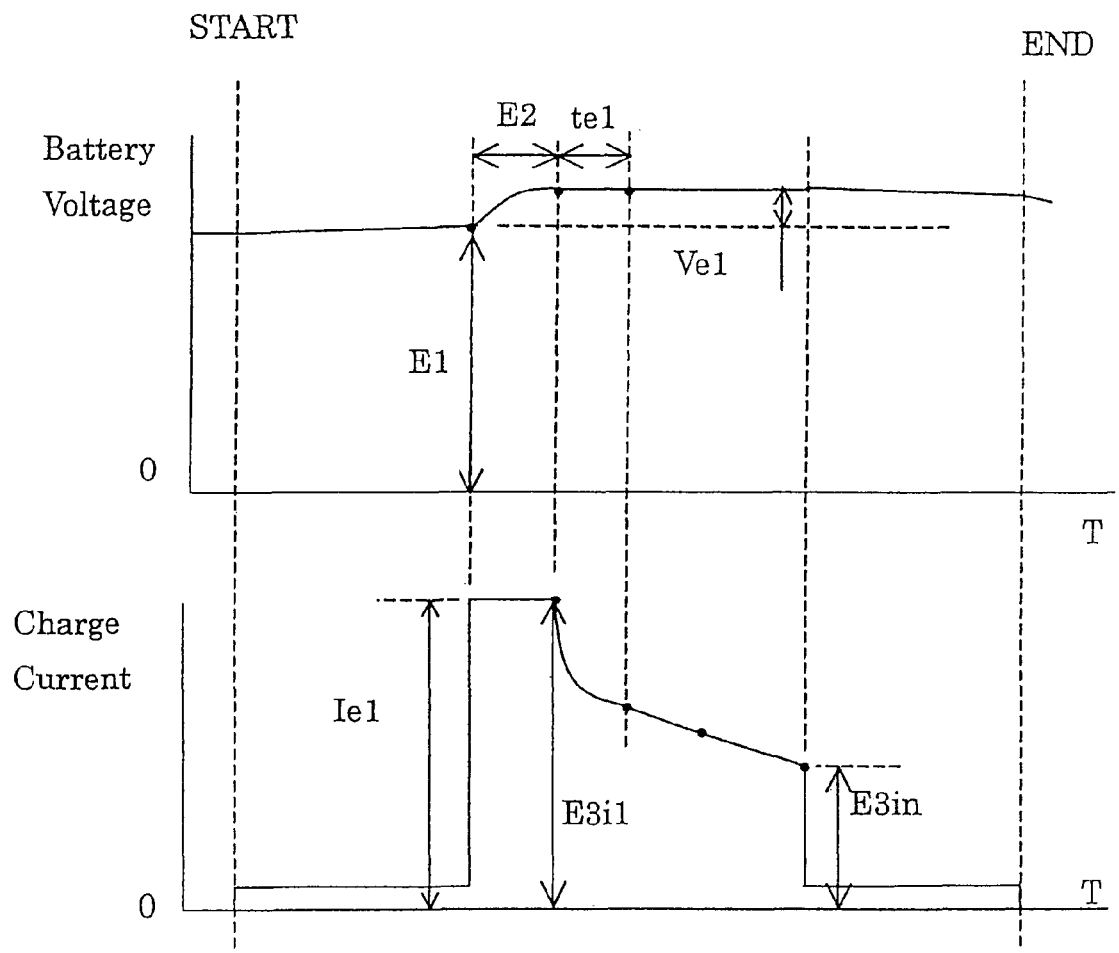

FIG. 7 shows a circuit for measuring current, voltage and time during constant current, constant voltage charging according to the invention, and battery charge voltage and charge current. The measurement means 213 that is used for this has a voltmeter and ammeter connected to the battery, and to measure the charge voltage at fixed time intervals, a trigger signal circuit, a timer, a counter, a constant current, constant voltage charging circuit and a time measurement circuit, connected as shown. First, voltage E1 of the subject battery is measured. Then, a fixed voltage Ve1 is set that is determined according to the battery type and rated voltage, and the time E2 it takes the subject battery to attain the voltage Ve1 is measured. Next, the battery charge voltage E3$i$1, E3$i$2, . . . , E3$in$ charged at a fixed time interval te1 is measured. The time E2 is determined by battery type, rated voltage, and so forth.

FIG. 8 is a diagram of a circuit for measuring the internal and surface temperature of a battery, according to the invention. As shown, the measurement means 214 that is used to measure the internal and surface temperature of a subject battery has a thermistor provided in proximity to the battery, affixed, for example, by an adhesive, and an ohmmeter connected to the thermistor, to measure the resistance of the subject battery. A trigger signal circuit, timer and counter are connected to the ohmmeter to enable the resistance of the subject battery to be measured at a plurality of points at fixed time intervals.

The measurements made using measurement means 211 to 214 are denoted simply as "n", "n'", "n''", "n'''", the "n" being a number that differs depending on the type and rated voltage of the battery, and the type of measurement; the number can be increased or decreased as desired, even when the same measurement method is used.

Returning once again to FIG. 2, the temporary storage means 215 is used to temporarily store the results of measurements of the cycle test battery 21 and the subject battery 22 by the measurement means 211 to 214. Measurements of the cycle test battery 21 are conducted at a plurality of ambient temperatures until the battery end of life, and the results are stored. Then, table generation means 216 uses the results to generate tables for each of the measurements, and the tables are stored in a table storage means 217.

The subject battery 22 is measured by the measurement means 211 to 214 and the results are stored in the temporary storage means 215. The data that were stored in the temporary storage means 215 are calculated by an arithmetic calculation means 218 and stored in a calculated results storage means 219.

A primary determination means 220 performs a determination on the calculated results that is based on the locations of the results in the tables. The primary determination means 220 compares data obtained by the various measurement means with the data in the tables, and the results of this determination are stored in a primary determination results storage means 221. Based on the results stored in the storage means 221, a secondary determination means 222 stochastically determines the present charge amount and degradation state of the subject battery 22. The results produced by the secondary determination means 222 are output by an output means 223 to the display of an electronic apparatus, to thereby show the present charge amount and degradation state numerically, or as a percentage, or graphically or the like.

Figure 9:
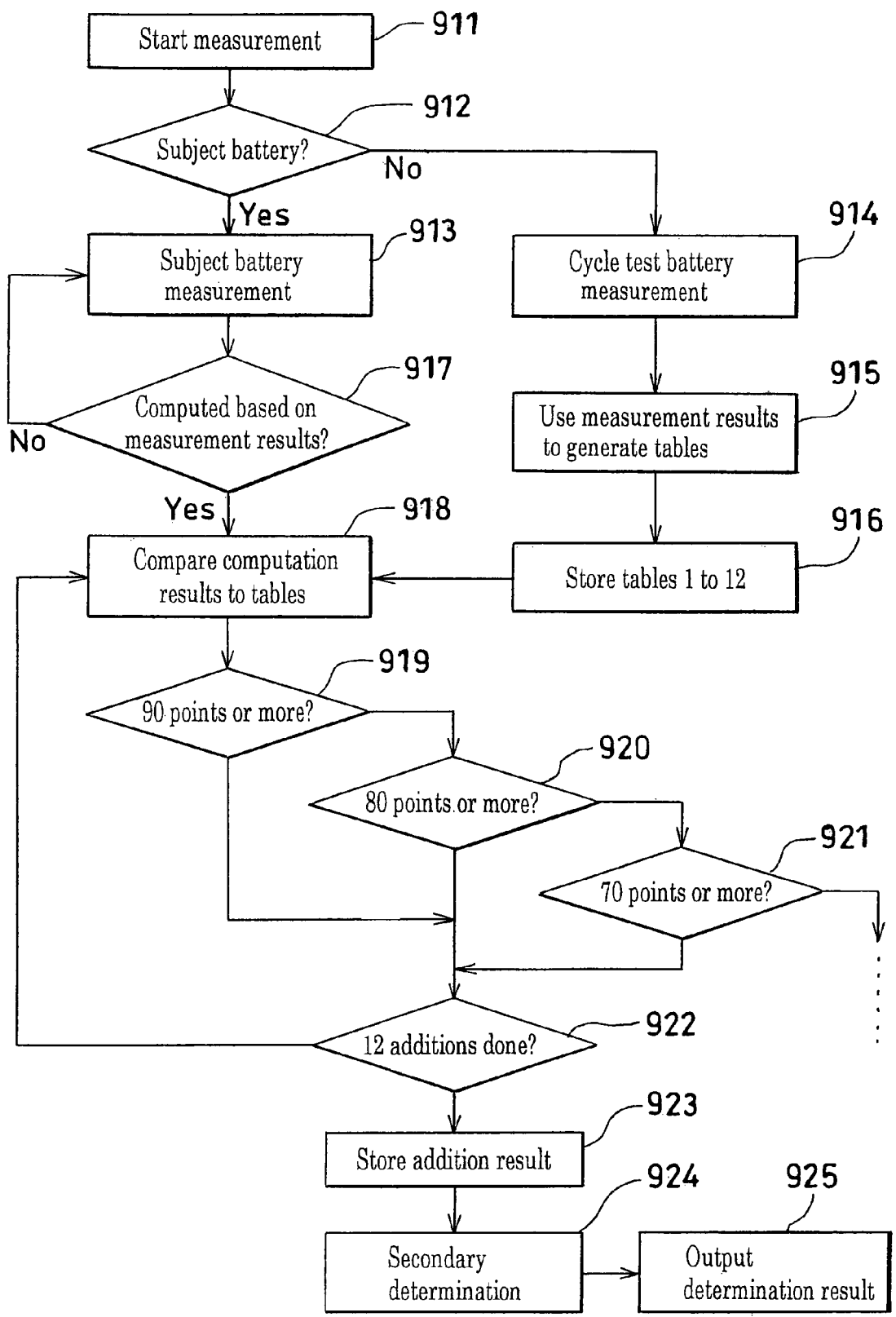
FIG. 9 is a flow chart for explaining the invention.

FIG. 9 is a flow chart for explaining the invention. FIG. 10 is a diagram for explaining a determination table according to the invention, produced using the results of measurement by the open voltage measurement means. The open voltage determination table of FIG. 10, which is based on open voltage measurements of the cycle test battery 21 until the battery end of life conducted at temperatures of below 10° C., from 10° C. to less than 40° C., and at or above 40° C., makes it possible to determine the present charge amount (RSOC) and degradation state (CYC).

The steps of determining the current amount of the charge in the subject battery 22 will now be explained with reference to FIGS. 2, 9 and 10. Battery measurement is started (Step 912). The system checks whether the battery is a subject battery 22 or a cycle test battery 21 (Step 912). If a control means (not shown) determines that the battery is a subject battery 22, each type of measurement relating to the subject battery 22 is performed (Step 913).

If in Step 912 the control means determines that the battery is not the subject battery 22, measurement of the cycle test battery 21 is started (Step 914) and the various measurements of the cycle test battery 21 are carried out by the measurement means 211 to 214 until the battery end of life, and the results are used by the table creation means 216 to generate the respective tables (Step 915), which are stored in the table storage means 217 as tables 1 to 12 (Step 916).

In Step 913, if the battery measurements have been done, arithmetic calculations are carried out based on the measurement data. At least twelve types of arithmetic calculations are carried out. The control means checks to ascertain whether or not all of the arithmetic calculations have been carried out (Step 917, if all measurements have been selected). If it is determined that the arithmetic calculation means 218 has not completed all the arithmetic calculations, the process returns to Step 913 to implement the measurements of the subject battery 22.

The control means compares the calculated results of the subject battery 22 measurements to the data of tables 1 to 12 generated from the measurements of the cycle test battery 21 (Step 918). The calculated results relating to the open voltage of the subject battery 22 are, for example, used to produce the open voltage determination Table 1 shown in FIG. 10. The results of a plurality of open voltage measurements of the subject battery 22 conducted at temperatures of below 10° C., from 10° C. to less than 40° C., and at or above 40° C., are compared with the open voltage determination Table 1 data, which show the relationship between prescribed charge amounts and degradation states based on measurements conducted on cycle test batteries at predetermined time intervals substantially until the battery end of life. Take, for example, a calculated result in the temperature range of 10° C. to less than 40° C. that is assumed to be 4.12V. In Table 1, there are two locations corresponding to 4.12V, in a present charge amount range of 80% or more and a degradation range of 20% or less.

Determination results are given a point rating based on the location in Table 1. Let us assume a rating of 90 or more points in the case of the above locations in Table 1.

The control means checks the points ratings of the table positions to examine how many points are to be assigned to the subject battery 22 (Steps 919, 920, 921). The control means checks whether the subject battery's points from all twelve tables have been added together (Step 922). The point numbers described above are just an example, and can be changed as desired in accordance with the intended battery application and other such factors. Using more tables results in a more accurate evaluation of the charge amount and degradation state. This being the case, using a points rating makes it possible to readily use means such as a computer to carry out an objective evaluation. As shown in FIG. 1, twelve tables are used for a primary determination. Other determination tables can be produced in the same way as the one shown in FIG. 10, to show the relationship between prescribed charge amounts and degradation states based on measurements conducted on cycle test batteries at predetermined time intervals until the battery end of life. If more tables are used to improve the accuracy, the batteries can be readily evaluated by giving points ratings to table locations and calculating averages, probabilities and so forth. If, for example, a battery was measured and it was found to have a point average (based on the points from multiple tables) of 70 points, it could be determined that the battery was not suitable for industrial use but was suitable for consumer applications. The above embodiment has been described with reference to being able to produce twelve tables. However, because batteries are constituted of chemical substances, there are variations from lot to lot, and even from individual battery to battery. In the face of such variation, using the averages of points determined according to determination table location is a way of implementing battery evaluations that are more correct.

The control means outputs the results of a secondary determination of the added points, point averages, results with high-percentage probabilities and the like, and the table data (Steps 924, 925). The output is shown in a display portion as the present charge amount and degradation state, shown numerically, or as a percentage, or graphically or the like.

With respect to the determination table of FIG. 10 and the primary determination method, various methods can be used in addition to those described. Because evaluations of the present charge amount and degradation state of a battery are shown as numbers of points according to the determination table location, the control means can readily also evaluate the charge amount and degradation state according to average points, probability and so forth.

The arithmetic calculation according to the measurement methods of FIGS. 3 to 8 will now be described. Using the method of FIG. 3 for measurements on a subject battery, the average of the measurements conducted at each of the fixed time intervals is obtained. That is:

$$A\text{ave}=(A1+A2+,\ldots,An)/n$$

The average voltage value during open voltage measurement determines the location in the open voltage determination Table 1 of FIG. 10. If the average value below 10° C. is 3.5V, for example, in Table 1 the locations for 3.5V gives a present charge amount (RSOC) of 20% to less than 40% and a degradation state of less than 10% or 20%. In this way, the present charge amount (RSOC) and degradation state (CYC) of the subject battery can be known by measuring the average open voltage of the battery.

When there are not many measurement results, the present charge amount (RSOC) and degradation state (CYC) is not accurate, so a plurality of different measurement methods are conducted and all the results used for an overall determination. Therefore, increasing the number n of measurements at fixed time intervals in the case of one measurement, or increasing the number of different measurement methods used, enables the present charge amount (RSOC) and degradation state (CYC) of the subject battery to be estimated with better accuracy.

The direct current resistance BZ of the subject battery is calculated from the battery voltage $B2v1, B2v2, \ldots, B2vn$ during constant current discharge and discharge current $B3i1, B3i2, \ldots, B3in$" measured at fixed time intervals by the method of FIG. 4. That is:

$$BZ=(B2v1+B2v2+,\ldots,+B2vn)/[(B3i1+B3i2+,\ldots,+B3in)/n]$$

A Table 2 (not shown) of direct current resistances BZ based on cycle test battery measurements conducted in a fixed temperature environment is generated.

The above formula is used to calculate the direct current resistance BZ of the subject battery, Table 2 is examined to find the location corresponding to the result, and the present charge amount (RSOC) and degradation state (CYC) are estimated based on the temperature at which the subject battery was measured and the location of the calculated results in Table 2.

The rate of discharge voltage decrease BRT is calculated from the battery voltage B2$v$1, B2$v$2, . . . , B2$vn$ measured at fixed time intervals during constant current discharge by the method of FIG. 4.

$$BRT=(B2v1-B2vn)/[tb1\times(n-1)]$$

Here, tb1 is the fixed time interval.

A Table 3 (not shown) of rates of decrease BRT based on cycle test battery measurements conducted in a fixed temperature environment is generated. The above formula is used to calculate the rate BRT of the subject battery. Table 3 is examined to find the location corresponding to the calculated result, and the present charge amount (RSOC) and degradation state (CYC) are estimated based on the temperature at which the subject battery was measured and the location of the calculated results in the table.

The return-up voltage BU following the termination of the discharge is calculated from the return voltage B2$v$1, B2$v$2, . . . , B2$vn$ measured at fixed time intervals after the termination of constant current discharge by the method of FIG. 4.

$$BU=B4vn'-B2vn$$

A Table 4 (not shown) of BU voltages following termination of discharge based on cycle test battery measurements conducted in a fixed temperature environment is generated. The above formula is used to calculate the voltage BU of the subject battery. Table 4 is examined to find the location corresponding to the calculated result, and the present charge amount (RSOC) and degradation state (CYC) are estimated based on the temperature at which the subject battery was measured and the location of the calculated results in the table.

The rate of rise of the return voltage BURT following the termination of the discharge is calculated from the battery return voltage B4$v$1, B4$v$2, . . . , B4$vn$ measured at fixed time intervals after the termination of constant current discharge by the method of FIG. 4.

$$BURT=(B4vn'-B2vn)/[tb2\times(n'-1)]$$

Here, tb2 is the fixed time interval.

A Table 5 (not shown) of BURT rates following termination of discharge based on cycle test battery measurements conducted in a fixed temperature environment is generated. The above formula is used to calculate the BURT rate of the subject battery. Table 5 is examined to find the location corresponding to the calculated result, and the present charge amount (RSOC) and degradation state (CYC) are estimated based on the temperature at which the subject battery was measured and the location of the calculated results in the table.

In measurements made during constant current, constant voltage discharge using the measurement method shown in FIG. 5, the time C2 it takes the voltage to fall to an arbitrary level (which differs according to battery type and/or rated voltage, etc.) is measured. A Table 6 (not shown) of C2 times based on cycle test battery measurements conducted in a fixed temperature environment is generated. As in the above, time C2 in the case of the subject battery is measured and Table 6 is examined to find the location corresponding to the measured time C2, and the present charge amount (RSOC) and degradation state (CYC) are estimated based on the temperature at which the subject battery was measured and the location of the measured result in the table.

The time C2 in the measurements conducted during constant current, constant voltage discharge using the measurement method shown in FIG. 5, is used to measure the discharge current C3$i$1, C3$i$2, . . . , C3$in$ discharged at fixed time intervals. A Table 7 of C3$in$ values based on cycle test battery measurements conducted in a fixed temperature environment is generated. As in the above, the C3$in$ in the case of the subject battery is measured, Table 7 is examined to find the corresponding location, and the present charge amount (RSOC) and degradation state (CYC) are estimated based on the temperature at which the subject battery was measured and the location of the measured result in the table.

The time C2 in the measurements conducted during constant current, constant voltage discharge using the measurement method shown in FIG. 5, is used to measure the discharge current C3$i$1, C3$i$2, . . . , C3$in$ discharged at a fixed time interval (tc1), and the measurement results are used to calculate the rate of current decrease CRT.

$$CRT=(C3i1-C3in)/[tc1\times(n-1)]$$

A Table 8 of CRT rates based on cycle test battery measurements conducted in a fixed temperature environment is generated. As in the above, the CRT rate of the subject battery is calculated, Table 8 is examined to find the corresponding location, and the present charge amount (RSOC) and degradation state (CYC) are estimated based on the temperature at which the subject battery was measured and the location of the measured result in the table.

Charge current and charge voltage are measured each time the charge current was changed at fixed time intervals during constant current, constant voltage charging, using the method of FIG. 6. D1$v$1, D1$v$2, . . . , D1$vn$ and D2$i$1, D2$i$2, . . . , D2$in'$ are used to calculate direct current resistance DZ. That is:

$$DZ=D1vn/D1in'$$

A Table 9 of direct current resistances DZ based on cycle test battery measurements conducted in a fixed temperature environment is generated. The direct current resistance DZ of the subject battery is calculated in the same way, Table 9 is examined to find the location corresponding to the result, and the present charge amount (RSOC) and degradation state (CYC) are estimated based on the temperature at which the subject battery was measured and the location of the measured results in Table 9.

In measurements made during constant current, constant voltage charging using the measurement method shown in FIG. 7, the time E2 it takes the voltage to fall to an arbitrary level (which differs according to battery type and/or rated voltage, etc.) is measured. A Table 10 (not shown) of E2 times based on cycle test battery measurements conducted in a fixed temperature environment is generated. As in the above, time E2 in the case of the subject battery is measured and Table 10 is examined to find the location corresponding to the measured time E2, and the present charge amount (RSOC) and degradation state (CYC) are estimated based on the temperature at which the subject battery was measured and the location of the measured result in the table.

The time E2 in the measurements conducted during constant current, constant voltage charging using the measurement method shown in FIG. 7, is used to measure the discharge current E3$i$1, E3$i$2, . . . , E3$in$ discharged at a fixed time interval (te1). The results of these measurements are used to calculate the rate of charge current decrease ERT.

$$ERT=(E3i1-E3in)/[te1\times(n-1)]$$

A table of ERT rates based on cycle test battery measurements conducted in a fixed temperature environment is generated. As in the above, the ERT rate in the case of the subject battery is calculated, the table is examined to find the corresponding location, and the present charge amount (RSOC) and degradation state (CYC) are estimated based on the temperature at which the subject battery was measured and the location of the measured result in the table.

The time E2 in the measurements conducted during constant current, constant voltage charging by the method shown in FIG. 7 is used to measure the discharge current E3$i$1, E3$i$2, . . . , E3$in$ discharged at a fixed time interval. A Table 12 of E3$in$ values based on cycle test battery measurements conducted in a fixed temperature environment is generated. As in the above, the E3$in$ in the case of the subject battery is measured, Table 12 is examined to find the corresponding location, and the present charge amount (RSOC) and degradation state (CYC) are estimated based on the temperature at which the subject battery was measured and the location of the measured result in the table.

The ambient temperature T of the subject battery is measured at fixed time intervals by the method of FIG. 8, and the average temperature Tavg of the measurements at T1, T2, . . . , Tn are calculated.

$$T\text{avg}=(T1,T2,\ldots,Tn)/n$$

This average temperature is used as the temperature at which the subject battery was measured in estimating the present charge amount (RSOC) and degradation state (CYC) based on result locations in Tables 1 to 12.

Tables 1 to 12 and the program for the method used to measure the subject battery are stored in a storage medium. The storage medium, sold or provided by battery retailers, can be used through battery purchasers to accurately gauge the charge amount and degradation state of their batteries. The tables and program can be made downloadable so that battery stores and the like can download the program to their information processing system. The tables and program can be provided free or sold to enable them to be obtained, together with a measurement apparatus, by anyone wishing to know a battery's charge amount and degradation state. The program and the table can also be stored in read-only memory (ROM). An electronic apparatus or information processing apparatus that includes the ROM and measurement apparatus also can be used to ascertain the charge amount and degradation state.

It is to be understood that the invention is not limited to the embodiments described in the foregoing. Instead, the design can be modified in various ways, within the claimed scope of the invention. Of the Tables 1 to 12, only Table 10 is shown, since the data concerned differs depending on the type and rated voltage of the battery concerned. However, as in the case of Table 10, tables showing relationships between prescribed charge amounts and degradation states can be generated based on data obtained by measuring cycle test batteries at fixed time intervals until the battery end of life.

n represents a number arbitrarily determined according to battery type and rated voltage, and the measurement methods used. The configurations shown in FIGS. 2 to 8 can used conventional means to attain their effect, so detailed descriptions thereof have been omitted.

The present invention is provided to resolve existing problems. It does this by providing the ability to quickly confirm the charge amount and degradation state of a battery. For this, measurements of cycle test batteries are carried out at predetermined time intervals substantially until battery end of life, and the measured values are used to generate determination tables showing relationships between prescribed charge amounts and prescribed degradation states that enable the amount of the charge in a subject battery to be predicted and the degradation state to be estimated in just a short time, such as by using a single measurement, for example.

By making it possible to determine the degradation state of batteries old and new, the invention can help prevent problems arising between battery retailers and their customers. It also makes it possible ascertain whether a battery used in an electronic instrument has enough life to complete a task, and therefore helps to conserve resources and prevent hazards caused by waste batteries.

The electronic apparatus of the invention can include a ROM containing the program of the method together with determination table data on which are based determinations relating to charge amount and degradation state of a battery. A portable such apparatus provided with the ROM could be used to show the predicted present charge amount and estimated degradation state on the display of the apparatus.

What is claimed is:

1. A method of confirming battery charge amount and degradation state, comprising:
    a first step of measuring or calculating at a plurality of battery temperatures a cycle test battery in respect of battery internal and surface temperatures and measurement values at least two selected from battery open voltage, current and voltage during discharge, and current and voltage during charging at prescribed time intervals substantially until an end of life of the cycle test battery;
    a second step of using the measured or calculated values to generate determination tables showing relationships in each case between charge amounts and degradation states at said prescribed time intervals;
    a third step of measuring or calculating a subject battery in respect of said battery internal and surface temperatures and said at least two measurement values selected from battery open voltage, current and voltage during discharge, and current and voltage during charging; and
    a fourth step of comparing determination table values with said battery internal and surface temperatures and each of the measured or calculated values of the subject battery to make a primary confirmation of a present subject battery charge amount and degradation state in accordance with determination table locations of matching values and to make an overall confirmation of results of the primary confirmation based on an appearance ratio of said determination table locations, thereby estimating said present subject battery charge amount and degradation state,
    wherein the fourth step is carried out by a computer and a display shows the estimated present subject battery charge amount and degradation state.

2. The method according to claim 1, in which a value of the battery open voltage is an average value of measurements made at fixed time intervals.

3. The method according to claim 1, in which the measurement of the voltage and current during discharge in a constant current discharge circuit comprises the steps of:
    measuring battery voltage;
    after discharge starts, measuring battery voltage a plurality of times at fixed time intervals;
    measuring discharge current a plurality of times at fixed time intervals simultaneously with the step of measuring battery voltage a plurality of times; and
    after terminating the discharge, measuring battery voltage a plurality of times at fixed time intervals.

4. The method according to claim 1, in which the measurement of battery voltage and current during discharge, and a measurement of time, in a constant current, constant voltage discharge circuit comprise the steps of:
    measuring battery voltage;
    subtracting a predetermined voltage from the measured battery voltage to set a constant voltage discharge value;

measuring a time from a start of the discharge until the set constant voltage discharge value is attained;

after the start of the discharge, measuring discharge current a plurality of times at fixed time intervals; and terminating the discharge.

5. The method according to claim 1, in which the measurement of current and voltage during constant current charging comprises the steps of:

measuring battery voltage;

after the step of measuring the battery voltage, starting the charging and measuring battery voltage when the charge current is changed a plurality of times at fixed time intervals;

measuring the charge current when the charge current is changed a plurality of times at fixed time intervals; and terminating the charging.

6. The method according to claim 1, in which the measurement of current and voltage, and a measurement of time, during constant current, constant voltage charging comprise the steps of:

measuring battery voltage;

adding a predetermined voltage to the measured battery voltage to set a constant voltage charging value;

starting the charging after setting the constant voltage charging value;

measuring a time at which the set constant voltage charging value is attained;

measuring the charge current a plurality of times at fixed time intervals; and terminating the charging.

7. The method according to claim 1, in which ambient temperature during the step of measuring the cycle test battery to generate the determination table and during the step of measuring the subject battery, is measured a plurality of times at fixed time intervals.

8. The method according to claim 2, in which ambient temperature during the step of measuring the cycle test battery to generate the determination table and during the step of measuring the subject battery, is measured a plurality of times at fixed time intervals.

9. The method according to claim 3, in which ambient temperature during the step of measuring the cycle test battery to generate the determination table and during the step of measuring the subject battery, is measured a plurality of times at fixed time intervals.

10. The method according to claim 4, in which ambient temperature during the step of measuring the cycle test battery to generate the determination table and during the step of measuring the subject battery, is measured a plurality of times at fixed time intervals.

11. The method according to claim 5, in which ambient temperature during the step of measuring the cycle test battery to generate the determination table and during the step of measuring the subject battery, is measured a plurality of times at fixed time intervals.

12. The method according to claim 6, in which ambient temperature during the step of measuring the cycle test battery to generate the determination table and during the step of measuring the subject battery, is measured a plurality of times at fixed time intervals.

13. A method of confirming a battery charge amount and degradation state according to claim 1, wherein the first step comprises any one of:

(i) a calculation of a direct current resistance BZ of the cycle test battery from a formula $BZ=(B2v1+B2v2+,\ldots,+B2vn)/[(B3i1+B3i2+,\ldots,+B3in)/n]$, in which $B2v1$ to $B2vn$ individually denote a battery voltage during constant current discharge, n denotes an integer of 2 or more and is applicable subsequently and $B3i1$ to $B3in$ individually denote a discharge current measured at fixed time intervals;

(ii) a calculation of a rate of discharge voltage decrease BRT from a formula $BRT=(B2v1-B2vn)/[tb1\times(n-1)]$, in which tb1 denotes a fixed time interval;

(iii) a calculation of a return-up voltage BU following termination of discharge from a formula $BU=B4vn'-B2vn$, in which $B4vn'$ denotes a return battery voltage measured ultimately after termination of discharge and n' denotes an integer of 2 or more and is applicable subsequently;

(iv) a calculation of a ratio BURT of the return-up voltage following the termination of discharge from a formula $BURT=(B4vn'-B2vn)/[tb2\times(n'-1)]$, in which tb2 denotes a fixed time interval after return;

(v) a measurement of a time C2 to lower the voltage to a predetermined optional value varying depending on at least one of a kind of batteries and rating in constant-current constant-voltage discharge;

(vi) a measurement of discharged currents $C3i1, C3i2, \ldots, C3in$ at a constant time interval tc1 from the time C2 in constant-current constant-voltage discharge;

(vii) a calculation of a rate of current decrease CRT from a formula $CRT=(C3i1-C3in)/[tc1\times(n-1)]$;

(viii) a calculation of a direct current resistance DZ from a formula $DZ=D1vn/D1in'$ obtained through measurements of charge voltages $D1v1, D1v2, \ldots, D1vn$ and of charge currents $D1i1, D1i2, \ldots, D1in$ made when changing a current at constant time intervals;

(ix) a measurement of a time E2 to charge voltage to a predetermined constant value varying depending on at least one of a kind of batteries and rating in constant-current constant-voltage charging;

(x) a measurement of discharge currents $E3i1, E3i2, \ldots, E3in$ changed at a constant time interval te1 from the time E2 in the constant-current constant-voltage charging; and (xi) a calculation of a rate of charge current decrease ERT from a formula $ERT=(E3i1-E3in)/[te1\times(n-1)]$.

* * * * *